United States Patent [19]
Pritchard

[11] Patent Number: 4,995,084
[45] Date of Patent: Feb. 19, 1991

[54] SEMICONDUCTOR EMULATION OF TUBE AMPLIFIERS

[76] Inventor: Eric K. Pritchard, Rte. 1, Box 536, Berkeley Springs, W. Va. 25411

[21] Appl. No.: 280,213

[22] PCT Filed: Mar. 23, 1988

[86] PCT. No.: PCT/US88/01025

§ 371 Date: Nov. 1, 1988

§ 102(e) Date: Nov. 1, 1988

[87] PCT Pub. No.: WO88/07787

PCT Pub. Date: Oct. 6, 1988

Related U.S. Application Data

[63] Continuation-in-part of Ser. No. 29,144, Mar. 23, 1987, Pat. No. 4,809,336.

[51] Int. Cl.⁵ .................. H04M 11/06; H04Q 11/04
[52] U.S. Cl. ........................... 379/94; 379/100; 370/110.1; 375/5
[58] Field of Search ............... 381/61; 307/547, 551, 307/555; 84/701

[56] References Cited

U.S. PATENT DOCUMENTS

| | | | |
|---|---|---|---|
| 3,008,092 | 11/1961 | Cawthra | 330/79 |
| 3,368,159 | 2/1968 | Richman | 330/103 |
| 3,382,450 | 5/1968 | Rockwell | 330/77 |
| 3,399,277 | 8/1968 | Davis et al. | |
| 3,860,876 | 1/1975 | Woods | 328/167 |
| 3,939,428 | 2/1976 | Shimizu et al. | |
| 3,973,461 | 8/1976 | Johns | |
| 4,000,474 | 12/1976 | Todokoro | 330/35 |
| 4,143,245 | 3/1979 | Scholz | |
| 4,180,707 | 12/1979 | Moog | |
| 4,211,893 | 7/1980 | Smith | |
| 4,286,492 | 9/1981 | Claret | |
| 4,439,742 | 3/1984 | Sondermeyer | 330/262 |
| 4,538,297 | 8/1985 | Waller, Jr. | 381/94 |
| 4,578,818 | 3/1986 | Claydon | 455/110 |
| 4,628,789 | 12/9186 | Fujimori | 381/61 |
| 4,680,795 | 7/1987 | Ecklund | 381/15 |
| 4,683,589 | 7/1987 | Scholz et al. | 381/61 |
| 4,701,956 | 10/1987 | Katoh | 381/61 |
| 4,803,731 | 2/1989 | Miimi et al. | 381/63 |

Primary Examiner—Forester W. Isen
Attorney, Agent, or Firm—Barnes & Thornburg

[57] ABSTRACT

A semiconductor system analog or digital processor (402) for emulating a vacuum tube amplifier having first distortion (372), tone control (373), and second distortion (374) circuits. The first distortion circuit (372) variably introduces even harmonics and the second distortion circuit (374) introduces even and odd harmonics. The second distortion circuit includes a variable gain circuit using diodes (275-286) and resistors (287-293) to progressively increase output current with increasing input voltage and clipping circuit. A speaker driving a microphone emulation circuit (379) is also provided. A distortion circuit varies the gain and harmonic contents as a function of amplitude, duration and number of cycles. An asymmetrical bias shifting circuit (60, 70) with a limiter also introduces even harmonics.

38 Claims, 4 Drawing Sheets

SEMICONDUCTOR EMULATION OF TUBE AMPLIFIERS

This application is a continuation-in-part of U.S. Pat. application Ser. No. 029,144, filed Mar. 23, 1987, now U.S. Pat No. 4,809,336.

BACKGROUND AND SUMMARY OF THE INVENTION

The present invention relates generally to amplifiers and more specifically to all forms of audio amplifiers and guitar amplifiers. It further relates to a distortion synthesizer which replicates the sounds produced by overdriven vacuum tube amplifiers.

Since semiconductor devices have become viable components for amplifiers, there has been a debate upon the virtues of semiconductor or solid state amplifiers versus the vacuum tube amplifiers. Some believe that tube amplifiers work better because vacuum tubes are more natural amplifiers than semiconductor devices. Some think that semiconductor amplifiers produce a sound that has no warmth; they are too clear until the semiconductor devices saturate, then they are too noisy. Tube amplifiers seem not to give up when overdriven, they seem to try to reach the impossible.

The vacuum tube amplifiers, however, do have some limitations. For some people, the limitation is simply the warmup time and the fragility of vacuum tubes. For guitarists the problems are more serious. A powerful amplifier does not sound right when operating at low levels such as those needed to fill a small room.

The prior art is filled with va ious attempts to satisfy the guitarists need for the tube amplifier sound with the more reliable semiconductor devices or just to enhance the sound from vacuum tube amplifiers. Moog, in U.S. Pat. No. 4,180,707, simulates the overdriven amplifier with a compressor and a clipper that can produce even harmonics as well as odd harmonics to produce the guitar sound at preamplifier power levels. Claret, in U.S. Pat. No. 4,286,492, modifies the operating point of the amplifier to clip at lower Power. Woods, in U.S. Pat. No. 3,860,876, heavily modifies the frequency response of a distorted input. Smith, in U.S. Pat. No. 4,211,893, selectively adds gain in a preamplifier stage to get distortion. Sondermeyer, in U.S. Pat. No. 4,405,832, switchable forces odd harmonic distortion and, in U.S. Pat. No. 4,439,742, creates a soft crossover distortion, also an odd harmonic phenomenon. Scholz, in U.S. Pat. No. 4,143,245, creates distortion at any sound level by operating an amplifier at maximum levels with resistive loads and driving the speaker with only a portion of the amplifier output.

In another vein, Todokoro, in U.S. Pat. No. 4,000,474, simulates a triode tube amplifier with junction field effect transistors.

The prior art is also filled with many examples of design built by many manufacturers of guitar amplifiers. Technically, the guitar amplifier is a poor example of vacuum tube amplifier design. Certainly, the guitar amplifier of today does not have the frequency response nor the clarity of the high fidelity amplifier of yesterday. However, the reason is not technical but lies in the art. The sound of inexpensive, overdriven amplifiers has become part of the art.

Thus, to simulate the vacuum tube amplifier, one must fully appreciate the nature of the components of said amplifier. One of the key components of a vacuum tube amplifier is the output transformer. The transformer passes a relatively narrow band of frequencies in the middle of the audio spectrum. The feedback in the power stage of the amplifier broadens the transformer response so that the amplifier operates effectively over a wider range of frequencies. However, when the amplifier tubes are saturated, they cannot perform the feedback function and the response narrows to the transformer response.

Of course, another key element of the vacuum tube amplifier is the tube itself. The various stages of a vacuum tube amplifier are usually coupled with capacitors that carry the signal from the output of one stage to the input of the next while blocking the constant or DC voltage of the output from the input. When the input of a stage is driven so that the grid of the vacuum tube becomes more positive than its cathode, then significant currents will flow in the grid circuit. Some of the grid current charges the coupling capacitor and thereby alters the operating point of the vacuum to amplify more asymmetrically than it usually does. When this asymmetrical waveform is amplified and clipped symmetrically by a push-pull output stage, as usually found in powerful amplifiers, it produces even as well as odd distortion harmonics. It is the even harmonics that seem to be more musical than the harsher odd harmonics.

Vacuum tubes, as all devices, has an input capacitance. The significant component of this capacitance is from the grid to the plate. This is the Miller capacitance and is multiplied by the gain of the tube. Consequentially, this input capacitance operates with grid driving impedance to limit the frequency response and to thereby change the tone of the connected musical instrument as a function of the setting of the volume control.

The gain of tubes is not constant with respect to grid voltage. The gain generally increases for increasing grid voltages. This is important when analyzing class B or AB push-pull output stages. The gain change produces harmonics in the output.

The output stage cannot use significant feedback because of the phase shifting in the transformer and other circuit components. Consequently, the output impedance of the output stage is comparatively high. This high output impedance reacts with the speaker load differently than a low output impedance. The output impedance that is associated with the proper sound is approximately that of the speaker impedance.

The output tubes of a class AB or B amplifier draw larger currents from the power supply as the input signal increases. The power supply reacts to this by lowering its output voltage according to its output impedance. However, since this output impedance is generally capacitive, a suddenly appearing large input signal will be amplified at a high clipping level for a short time and then will progress to a lower clipping level. This effect is part of the punch of the amplifier and makes the amplifier sound less compressed.

There are digital devices currently available for producing audio effects such as chorus, flanging, reverberation, vibrato, sampling, pitch change, etc. The delay effects, such as flanging, reverberation and sampling, simply record the signal and play it back later. Pitch change records the signal and plays it back at a different rate. Harmonic analysis of these effects show that all extra frequencies that are generated are created by sampling. None of these effects intentionally introduce harmonics of the signal into the signal.

Another view of these effects is that their basic intent is to recombine a signal that has been delayed and may have been attenuated with itself. Thus, the only harmonics that can be generated are due to the sampling process.

Thus, the primary object of the invention is to provide a semiconductor amplifier which simulates the distortion of a vacuum tube amplifier.

Another object of the invention is to simulate the effects of grid current flowing. This produces even harmonic distortion which is a more pleasant and musical distortion than one made of solely odd harmonics. Further, the grid current effects in a capacitively coupled circuit produces the desirable attach on a note.

A further object of the invention is a guitar amplifier effects preamplifier which may be elegantly professional or may be a simple effects pedal. This is quite possible from the teachings herein because the tube simulation may be done either at low or at high power levels.

A still further objection of the invention is to achieve the general improvement of guitar amplifiers of all types to provide the high power distortion effect at all power levels.

An even further object of the invention is to provide a general use power amplifier which graciously handles excessive inputs.

Another object of the invention is to provide an amplifier with the correct input and output impedances to load the guitar or other source correctly and to drive the speaker correctly.

Another object of the invention is to provide an amplifier with a non-constant or variable gain stage to emulate the distortion of a Class B or AB output stage.

A still further object of the invention is to provide control of the output level of an amplifier as a function of the output level to emulate the effect of the power supply impedance.

An even further object of the invention is to provide an amplifier with a combination bias shifter and distortion stage that operates effectively at low input levels.

A still further object of the invention is to provide mathematical modeling of an amplifier so that the amplifier effect may be created via a digital signal processor.

An even further object of the invention is to provide analog and digital signal processors which intentionally introduces harmonics of the signal into the signal.

A still further object of the invention is the structure of the analog amplifier or the order of calculations of the digital signal processor.

These and other objects of the invention are attained by a distortion synthesizer, having a first distortion circuit, a tone control circuit for altering the tonality of the first distorted signal and a second distorted circuit for introducing harmonics into said tone controlled signal and for clipping the resultant signal as a function of said resultant signal. The system may be analog or a programmed digital processor. The first distortion circuit limits and introduces even harmonics by an asymmetrical bias shifting circuit. The first distortion circuit can also compress the signal. The second distortion circuit includes a variable gain stage which increases with increased input using a plurality of switches which progressively add parallel resistors to progressively increase output current. The clipping circuit in the second distortion circuit clips as a function of amplitude, time or frequency content of the input signal. A direct equalization circuit is provided which emulates a speaker audibly driving a microphone and includes a filter, delay and mixer.

The distortion system provides a distorted signal whose harmonic content increases with increasing input signal. The even harmonics content is initially increased with each cycle of an input signal. Also, the gain and total harmonic distortion increase for a first range of input signal amplitudes, and the gain decreases, and total harmonic distortion increases for a second range of input signal amplitude. In addition, the amplitude of the distorted signal initially decrease and subsequently increases the amplitude of the distorted signal.

Other objects, advantages and novel features of the present invention will become apparent from the following detailed description of the invention when considered in conjunction with the accompanying drawings.

DETAILED DESCRIPTION OF THE DRAWINGS

A distortion synthesizer which replicates a vacuum tube amplifier having a transformer output would include asymmetrical attenuation of inputs signal an bias point shifting to produce even harmonics for large input signals, an asymmetrical, non-constant gain to produce both even and odd harmonics for small input signals, and a clipping circuit whose clipping level is a function of the output to decompress large input signals.

Figure 1:
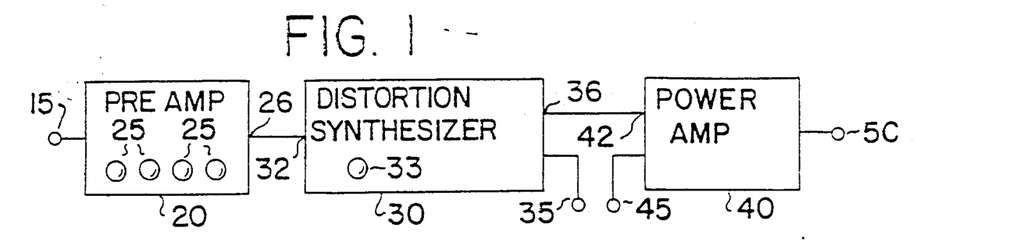
FIG. 1 is a block diagram of an audio amplifier incorporating the principles of the present invention.

An amplifier incorporating the principles of the present invention is illustrated in FIG. 1 as including an input 15 connected to a preamplification or input stage 20. A plurality of adjustments 25 are provided on the preamplifier 20. These include frequency controls, for example, bass and treble, as well as gain control. The output 26 of the preamplifier 20 is connected to the input 32 of distortion synthesizer 30 which replicates the distortion of a vacuum tube amplifier. A variable control 33 is provided to select the distortion tone or the frequency of the distortion synthesizer's filter. The first output 36 of the distortion synthesizer 30 is connected to the input 42 of the power amplifier 40. A second output 35 of the distortion synthesizer 30 is available for connection to other types of effect devices available in the industry. Input 45 provides a second input to the power amplifier stage 40 from other sources other than the source 15 and more particularly the outputs of the effect devices driven by the signal from output 35. The output of the power amplifier output stage 40 is provided on terminal 50.

Figure 2:
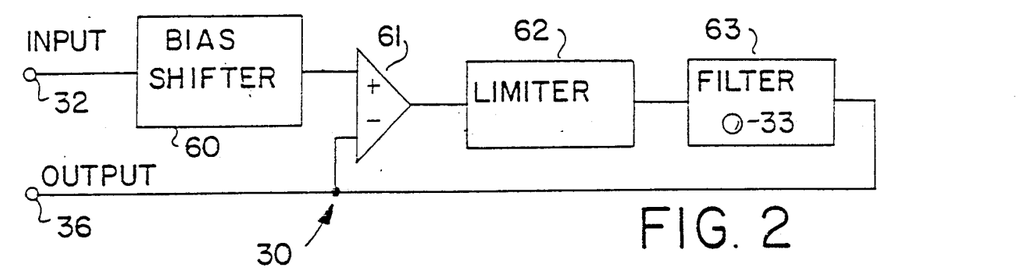
FIG. 2 is a block diagram of a distortion synthesized according to the principles of the present invention.

The block diagram of a preferred embodiment of the distortion synthesizer 30 is shown in FIG. 2. The input 32, after any required preamplification, drives the bias shifter 60 which drives the non-inverting input of amplifier 61. The output of amplifier 61 is limited by limiter 62. The limiter output is then filtered by filter 63 to produce the output 36 and feedback to the inverting input of amplifier 61. The physical realization of these functions is quite well defined by the electronics arts, for example, in a book by Tobey, Graeme, and Huelsman, "Operational Amplifiers, Design and Applications", McGraw-Hill.

The response of this embodiment when the signal is significantly limited, is that of the filter. The gain of the filter can be expressed in FORTRAN as $$F = s*h*x/[(s+w)*(s+x)]$$

where
s = the Laplace transfer operation
h = the maximum gain of the filter
w = the low frequency cutoff in radians/sec.
x = the high frequency cutoff in radians/sec.
Furthermore, let the output of the amplifier can also be expressed in FORTRAN be $$A = Vp*b - Vm*a$$

where
Vp = the non-inverting input voltage
b = the non-inverting gain
Vm = the inverting input voltage
a = the inverting output gain
Then the response for the above system, when there is no limiting, is $$R = s*b*h*x/((S+w)*(s+x) + s*a*h*x)$$

which has the following approximate characteristics:
center frequency gain = b*h/(1+a*h)
low frequency cutoff = w/(1+a*h)
high frequency cutoff = x*(1+a*h)
This amplifying system then produces a larger bandwidth with lower low frequency cutoff and higher high frequency cutoff than the filter 63 when a*h is larger than zero and preferably three or larger.

Notice that this block diagram consists of functions that are each well known in the electronics arts that may be implemented with variety of technologies, vacuum tubes, semiconductors, linear integrated circuits, and digital signal processors.

Figure 3:
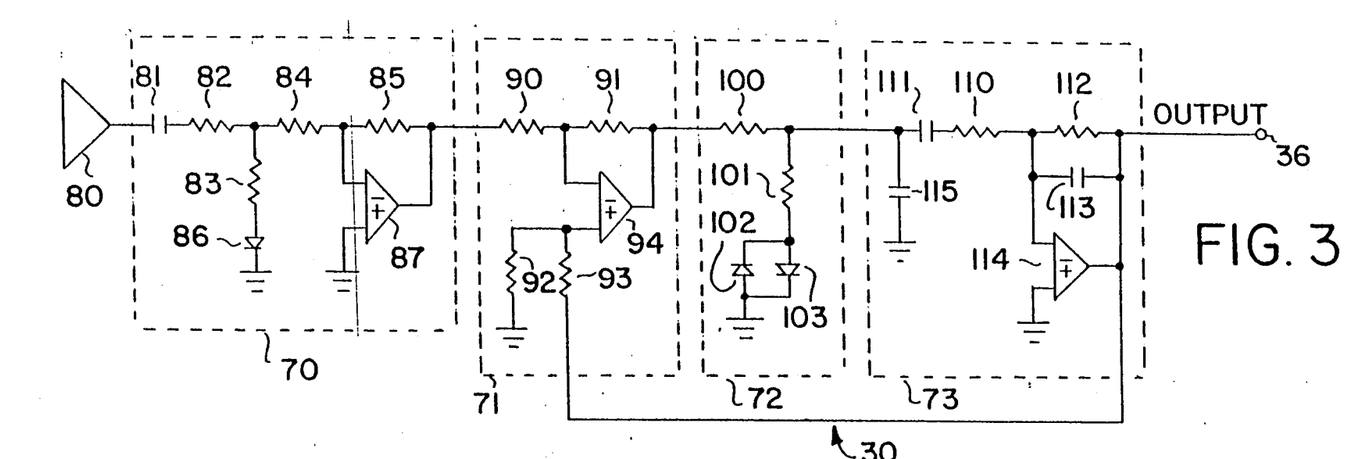
FIG. 3 is a schematic of a distortion synthesized low power level operation according to the principles of the present invention.

An embodiment for the block diagram of FIG. 2 is shown in FIG. 3. The bias shifter 70 is similar to bias shifter 60. The amplifier 71 is similar to amplifier 61 except that actual amplifiers exhibit limiting as their output voltages approach their power supply voltages The limiter 72 is similar to limiter 62 except that it depends upon the limiting nature of the amplifier 71 and that it provides a reasonably large output impedance for the filtering circuit 73. Again, the filter 73 is similar to filter 63.

The input signal on input 32 is from a preamplifier 80 which is configured as required. The bias shifter 70 is capacitively coupled by capacitor 81. Resistors 82, 84 and 85 form a standard inverting amplifier with operational amplifier 87 until the signal becomes greater than the conduction voltage of diode 86. Then the signal faces the same alterations as the signal through a tube that has grid current, namely, the signal is asymmetrically attenuated and the signal is offset by the charge on capacitor 81. Resistor 83 limits the charging rate of the capacitor 81 and thereby prolongs the bias shifting process gradually on a plurality of cycles. Limiting the charging rate is important because the attack of a note is then not offset while later portions of the note are offset. The limiter 72 can thus create waveforms with more power for the attack on the beginning than for the later portions of the note which is highly distorted. This additional power is needed to achieve the desired musical effects.

The amplifier 71 includes resistors 90 through 93 and an operational amplifier 94. Appropriate choices in resistor values can create the required gains a and b above. The operational amplifier 94 also helps the limiting function 62 by limiting its own output to be between the power supply voltages.

The function of limiter 62 is completed by limiter 72 which uses two resistors 100, 101 and two diodes 102, 103. This specific construction of resistors and diodes not only limits or clips the signal, but also produced harmonics with smaller amplitudes than clippers without resistor 101. The resistor 100 is similar to the unsaturated plate resistance of the output tube, while resistor 101 is similar to the saturated plate resistance. The diodes have a voltage drop similar to the maximum voltage excursion of the plate voltage. These diodes are preferably light emitting diodes chosen for their voltage versus current characteristics. Of course, these similarities are in a proportional sense because inexpensive operational amplifiers have smaller voltages and currents than amplifier output tubes.

The filter 73 is realized with high-pass components 110 and 111, and low-pass components 112 and 113 connected to operational amplifier 114. Capacitor 115 loads the limiter to produce another rolloff in the filter response. This additional reactive component and its consequential additional rolloff produces a twelve decibel per octave rolloff in the audio range for a sweeter distortion toneality.

This filter 73 is a generic representation of a generalized filter. In practice is desirable to make the frequency cutoffs variable. This provides the musician or listener distortion tone controls to control the tone of the distortion. Since the feedback extends the frequency response, the distortion tone controls have little effect on the unsaturated operation.

At low input signal levels, the diodes 86, 102 and 103 do not conduct and therefore do not produce any level shifting or limiting. The transfer characteristics of the distortion synthesizer 30 is clear, broad and undistorted.

At high input signal levels, the diodes do conduct to produce a narrower band of signals with both even and odd harmonics. The actual values of the above components are chosen quite subjectively. The ultimate design must suit the ear of the musician.

It should be now clear that one of the objectives of this invention has been met in that the frequency response is varied as a function of input signal levels. A guitar amplifier can be synthesized at low power levels by providing the distortion synthesizer 30 of FIGS. 2 and 3 between preamplifier stage 20 and an output power amplifier stage 40. This results from the use of diodes to determine the signal level at which distortion takes place. Furthermore, it can be executed reliably using inexpensive components.

Figure 4:
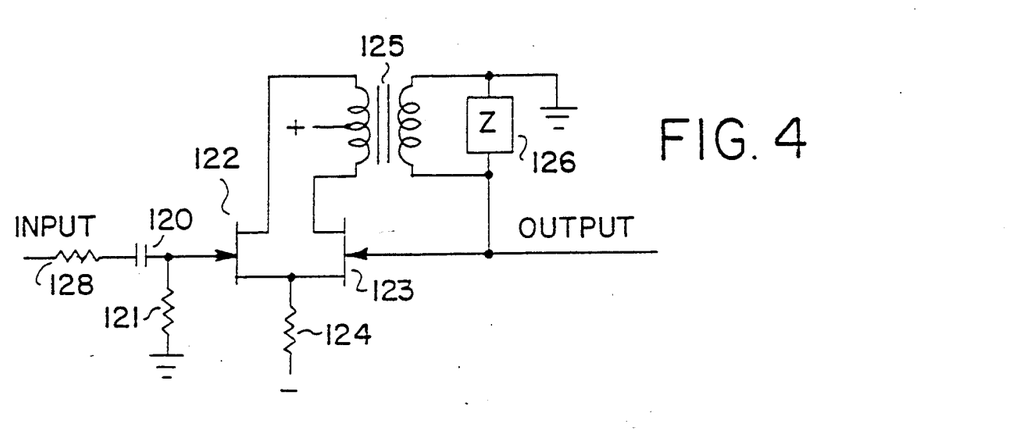
FIG. 4 is a schematic of another distortion synthesized according to the principles of the present invention.

An alternate distortion synthesizer design is shown in FIG. 4. The input is coupled by a capacitor 120 and resistor 128. The resistor 121 biases a junction field effect transistor, JFET 122. This JFET 122 is in a push-pull configuration with JFET 123. They combine to drive transformer 125, which in turn drives a filtering load 126 and provides feedback to JFET 123. In this case, excessive input causes the gate of JFET 122 to conduct and thereby charge. Clipping may be created by sizing resistor 124 to limit the current. Filtering is done by the transformer 125 and load 126.

Although this design uses a few components, it may not have as a reliable design because JFETs have broad ranges of characteristics.

The loading of transformer amplifiers with the load 126, which includes a capacitor, will create an additional rolloff which can produce a twelve decibel rolloff in the audio range when this circuit is distortion to further enhance the distortion tone. It is further possible for this capacitor to resonate with the transformer to enhance the desired mid-range response.

The loading of standard tube amplifiers with a capacitive reactance will produce the desirable additional rolloff without significantly diminishing the output power.

An alternate location for resistor 128 is between the capacitor 120 and the JFET 122.

The use of resistor 128 in series with the gate of the JFET 122 limits the bias shifting charging current when the JFET is driven to conducting gate current. This is not usually found in amplifiers because it reduces the circuit gain, especially at high frequencies. But it is necessary in order to give the note that overdrives the amplifier an attack time and as such serves a similar function as resistors 82 and 83 of FIG. 3.

The diode 86 of FIG. 3 and the gate of JFET 122 of FIG. 4 both lead to an asymmetric impedance which changes the charge on a coupling capacitor to create a bias shift as a function of the input signal. There are many other circuit structures that will do this as well, for example, the degeneration shows a dramatic change in input impedance when the transistor saturates. However, unless bias shift were design criteria, a series resistor such as 128 would not be used because it lowers the gain and increases the amplifier noise.

Figure 5:
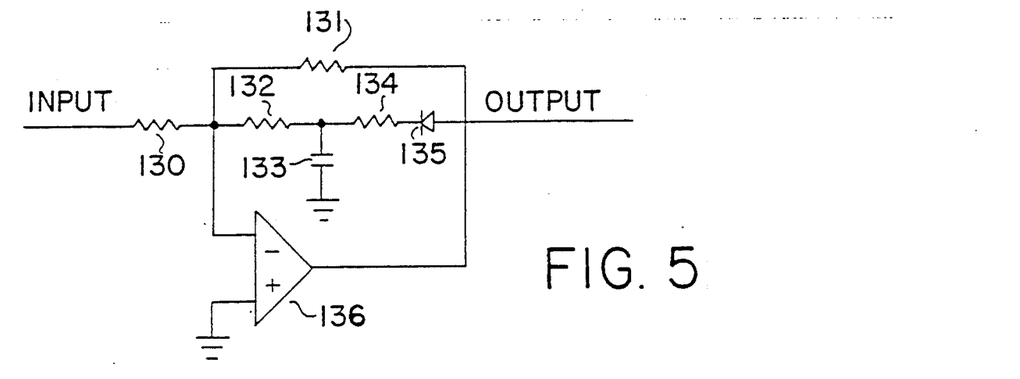
FIG. 5 is a schematic of another bias shifter according to the principles of the present invention.

There are other possibilities for producing the bias shifter 60, such as found in FIG. 5. At low input signal levels the operational amplifier 136 works with resistors 130 and 131 only. But when the output exceeds the voltage drop of diode 135, then capacitor 133 charges up through resistor 134 and the diode 135. Resistor 132 then puts the resulting off-set on the input and consequently produces a level dependant offset that will work with a symmetrical clipper to produce both even and odd harmonics.

Note that this circuit may have an asymmetrical gain as opposed to an asymmetrical attenuation of capacitor 81, resistors 82 and 83, and diode 84 of FIG. 3. Whether these circuits have gain or attenuation, they do have an asymmetrical transmission.

These various examples show a general theme of synthesizing the operation of a tube amplifier with semiconductors by using a circuit which has a frequency response dependent upon the input signal level. It is further conceivable that a tube amplifier could be designed to limit or clip without drawing grid current and thereby produce even harmonic distortion. Consequently, the even harmonic distortion circuits are not necessary to synthesizing the tube operation, but are desirable since the even harmonics are more musical.

The operation of a distortion synthesizer that simulates the input to output characteristics of a tube amplifier has been described. This circuit may be implemented in a variety of ways, with semiconductors or tubes, with transformers or filters, just not tubes and transformers since that is the art being synthesized.

Figure 6:
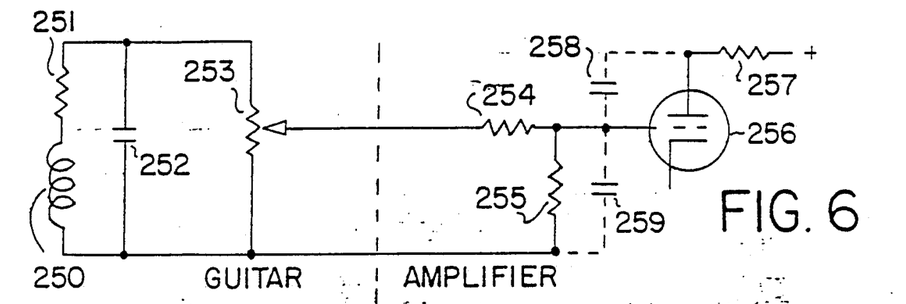
FIG. 6 is a schematic of the input of a guitar amplifier according to the principles of the present invention.

FIG. 6 depicts a typical guitar circuit coupled with an input circuit of a tube amplifier. Components 250 through 252 represent the inductance, resistance, and capacitance of a guitar pickup respectively. Variable resistor 253 is the guitar volume control. The signal on the wiper of the volume control is carried via phone jacks, phone plugs and coaxial cable to the amplifier where it goes through a resistance 254. Resistor 255 is the grid bias resistor for tube 256. Resistor 257 is the plate supply or load resistance. Capacitor 258 is the plate to grid capacitance or Miller capacitance. Capacitor 259 is a collection of other input capacitances.

The design of a semiconductor amplifier need only replace the tube 256 and resistor 257 with an inverting amplifier with either capacitive feedback, i.e. capacitor 258, or equivalent input capacitance 259. Linear amplifier theory indicates that the input capacitance effect of capacitor 258 is equivalent to a capacitance 259 equal to the capacitance 258 times the gain of the amplifier.

Thus, the correct input impedance of a semiconductor guitar amplifier to properly load a guitar or input source includes either a shunt capacitance or a feedback capacitance appropriately sized to replicate that of a tube amplifier, approximately 300 pifarads which is significantly larger than possible stray capacitance. The source of the capacitance need not be a capacitor. It may be the capacitance of a diode junction, the capacitance of a transistor junction, the capacitance of the gate to channel of a field effect device, printed circuit wiring such as microstrip, etc.

VARIABLE GAIN

The output stage of a tube amplifier typically consists of a phase splitter and a pair of output pentode tubes operating in class B or AB. The transconductance of the pentodes increases with increasing grid voltage. Assuming that the pentodes have the same characteristics, the changing gain produces odd harmonic distortion. However, the pentodes are generally not matched or not matched perfectly and, consequently, even harmonics are produced as well.

Figure 7:
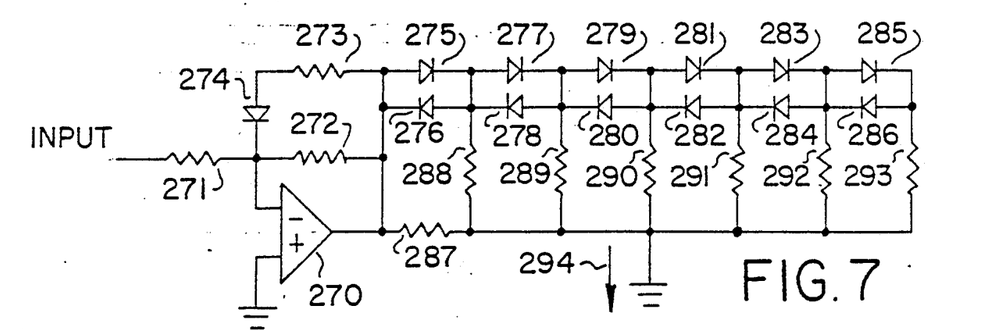
FIG. 7 is a schematic of the variable gain stage according to the principles of the present invention.

FIG. 7 shows a variable gain amplifier which produces a current from an input signal which has both even and odd harmonics of the signal. The circuit has an operational amplifier 270 with its non-inverting input grounded. The input signal current passes through resistor 271. This current is matched by the feedback currents in resistors 272, 273. The diode 274 limits the current flow in resistor 273 to essentially one direction. The gain of this stage is then proportional to resistor 272 for one polarity input and, neglecting the diode forward voltage, proportional to parallel value of resistors 272 and 273 for the other polarity input. This portion of the circuit generates the even harmonics corresponding to the tube mismatch.

The circuit of FIG. 7 continues with diodes 275 through 286 operating as switches and resistors 287 through 293 that convert the output of operational amplifier 270 into current 294 (which is shown going to ground because the input to the following stage is approximately ground). For output voltage magnitudes less than one diode drop, this current is proportional to the conductance of resistor 287. For output voltage magnitudes between one and two diode drops, the current change is proportional to the sum of the conductances of resistors 287 and 288. Similarly, for magnitudes between two and three; the current change is proportional to the sum of the conductances of resistors 287 through 289. The operation of the diodes simply brings more and more resistors in parallel until, for output voltage magnitudes greater than six diode drops, the change in current 294 is proportional to the sum of the conductances of resistors 287 through 293. This relationship of voltages and currents generates odd harmonics.

The even harmonic amplitudes may be controlled by the relative values of resistors 272 and 273. Large values for resistor 273 produce even harmonics with smaller amplitudes than smaller resistor values. Similarly, large values for resistors 288 through 293 produce odd harmonics with smaller amplitudes than smaller resistor values. The individual amplitudes of the odd harmonics can be changed by changing the values of resistors 288 through 293. If these resistors are equal, then the circuit approximates the square law transfer characteristic often applied to vacuum tubes.

The number of diodes and resistors may be increased to handle larger voltages at the output of amplifier 270. This example works with signals up to about 4 volts peak when the diode forward drop is about 0.6 volts. The number of sections of a pair of diodes and a resistor, as well as the resistor values, determines the smoothness of the gain variation.

A mathematical view of the variable gain circuit is that the diodes and resistors form a piecewise linear approximation to the variable gain. Another view of the variable gain circuit is that the ratio of the output signal to the input signal increases with an increasing input signal.

Figures 8, 9:
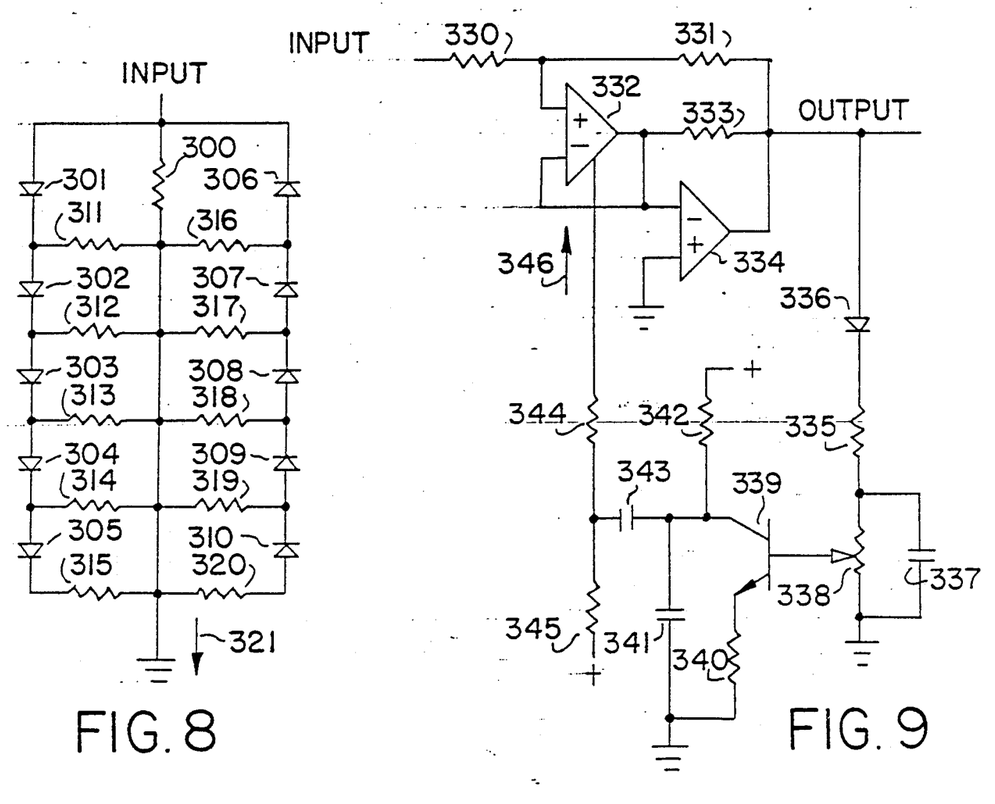
FIG. 8 is a schematic of the variable attention stage according to the principles of the present invention.
FIG. 9 is a schematic of the power supply impedance effect emulator according to the principles of the present invention.

FIG. 8 shows a non-constant attenuator similar to a portion of FIG. 7. Here diodes 301 through 305 and resistors 311 through 315 handle positive currents while diodes 306 through 310 and resistors 316 through 320 handle negative currents. The current 321 for input voltage magnitudes less than one diode drop is proportional to the conductance of resistor 300. The current change for positive voltages between one and two diode drops is determined by resistors 300 and 311. For inputs between two and three drops, the current change is determined by resistors 300, 311 and 312. Greater voltages involve more resistors. The current changes for negative voltages are determined similarly. FIG. 8 is more flexible than FIG. 7, but may be more expensive.

The operational amplifier art is replete with non-linear amplifying circuits, some may be found in the aforementioned text "Operational Amplifiers, Design and Applications", Tobey et al., McGraw-Hill.

PUNCH EFFECT EMULATION

FIG. 9 is the schematic of a punch effect emulator with some enhancement. Punch is the reduction in output power immediately after the beginning of a large input signal. The power output is reduced by two phenomena, the introduction of even harmonics in a system with a clipper, and the collapse of the power supply voltage created by the increased current requirements of large signals. The power supply voltage falls slowly, over about 0.2 seconds, as determined by the size of the filter capacitors, the impedance of the transformer, and the impedance of the transformer primary under load. The power supply voltage stays low until the signal is lowered or removed. The enhancement of the effect is to allow the voltage to return even if the signal has not diminished.

Another view of the power supply effect is that with the power supply effect the amplifier or sound sounds alive and without giving the effect that the sound is too compressed.

Resistors 330 and 331 are the input and feedback resistors of a standard inverting operational amplifier circuit. Amplifier 332 is an operational transconductance amplifier, such as a National Semiconductor LM3080, connected in a unity gain configuration. It drives an operational amplifier 334 with feedback resistance 333. The maximum current that the transconductance amplifier can produce is determined by the bias current 346 (Pin 5 of the LM3080). Thus, the maximum voltage that can appear at the output is proportional to the product of the bias current and the resistance of resistor 333. Thus, the output voltage has a clipping level proportional to the bias current.

The components 335 through 338 produce a signal on the base of transistor 339 in response to the output signal. Resistor 335 limits the charging current to capacitor 337 as well as isolates operational amplifier 334 from a capacitive load. Diode 336 rectifies the output signal. Capacitor 337 smooths the rectified signal while potentiometer 338 permits the effect to be varied from off to some maximum value. Resistor 340 is an emitter degenerator and makes the current transistor 339 roughly proportionally to the signal volgate on its base. Capacitor 341 reduces the change rate of the voltage on the collector of transistor 339. The transistor collector signal is passed via capacitor 343 to the bias setting network of operational amplifier 332 including resistors 344 and 345. If the output signal increases in amplitude due to increased input signal, then the voltage on the base of transistor 339 increases. The consequential collector current reduces the collector voltage with a time constant determined in part by capacitor 341. Capacitor 343 passes this signal to the bias network to decrease the bias and thereby reduce the output signal. The capacitor 343 charges slowly allowing the bias to increase and thereby permitting the output signal to increase. This effect is an enhancement of the power supply effect of tube amplifiers which reduce the compressed effect so common to transistor amplifiers.

The enhancement of the effect is produced by capacitor 343. If this capacitor were not in the circuit, i.e., shorted, then the output signal will be reduced by the voltage on capacitor 341 and does not get larger until the input signal goes down and back up. This is similar to the power supply of an amplifier whose voltage drops with large current requirements and does not return until those requirements are no longer present.

The response of the punch effect emulator to a tone burst with the tone off for one second and on for one second with sufficient amplitude to cause the circuit to clip, is initially a maximum. This, in a time determined largely by capacitors 341 and 343, the current in transistor 339 and resistors 342, 344, 345 approximately 0.2 seconds, decays to a minimum level. Then, if the enhancement were not present, this minimum level remains until the end of the tone burst. The enhanced circuit then allows the output level to return to the maximum in a time determined largely by capacitor 343 and resistors 344, 345, about 0.5 seconds. When the tone burst goes off, the punch effect capacitors 341, 343 discharge in preparation for the next tone burst. Potentiometer 338 controls the minimum level and the extent of the punch effect.

The punch effect circuit is one which has a clipping or limiting level which is a function of the output level as well as time and previous output signals.

The resistor 333 is representative of a network that limits the frequency response as a function of the level. The resistor 333 may be replaced with a parallel resistor and capacitor. The maximum output level is then a function of the frequency as well as the bias. Thus, replacing resistor 333 with a network alters the frequency response when clipping, i.e. the bandwidth or bandpass is narrowed, or high frequency is reduced as a function of the input signal.

Figure 10:
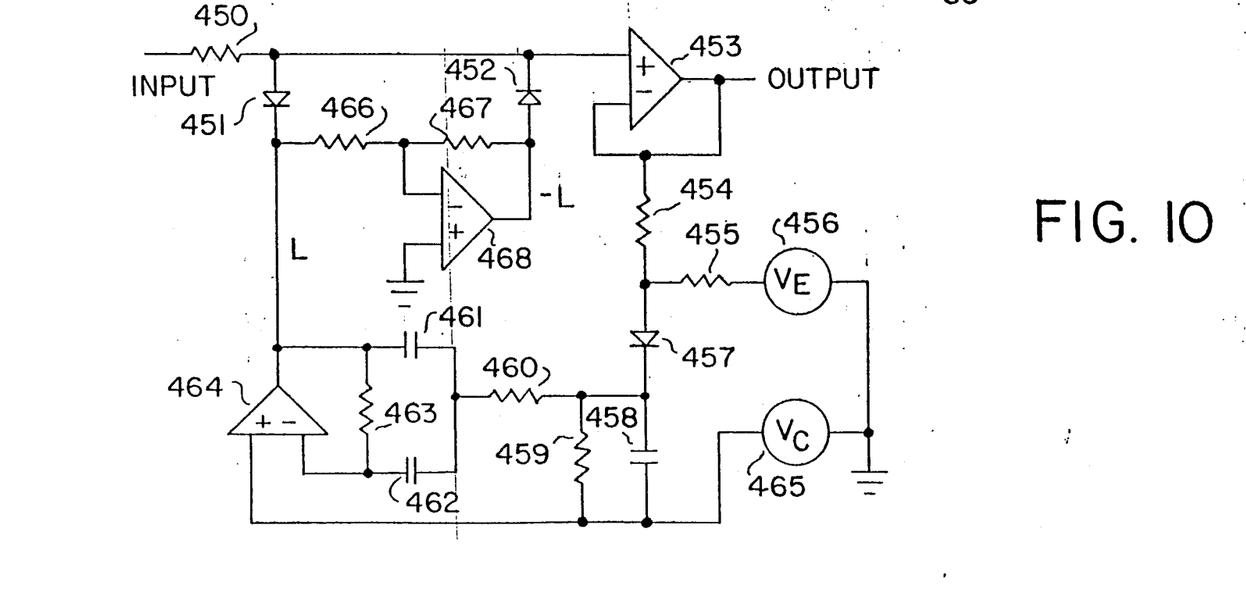
FIG. 10 is a schematic of an alternative to FIG. 9.

An alternate punch effect circuit is shown in FIG. 10. The input signal passes through resistor 450 to clamping diodes 451 and 452 and to buffer amplifier 453 which provides the output signal. The input signal is clamped by diode 451 if it exceeds a voltage L by a forward diode drop. It is also clamped by diode 452 if it is less than a voltage −L by a forward diode drop. The balance of the circuitry shown in FIG. 10 creates the clamping voltages L and −L as a function of the output signal. The resistor 454 not only limits the rate of charge of capacitor 458 but with resistor 455 and voltage source 456 sets the extent of the punch effect. When the voltage source 456 is large, the effect is large, when it is small, the effect is small. Diode 457 detects the offset and attenuated output signal and charges capacitor 458 accordingly. Resistor 459 discharges capacitor 458.

The signal on capacitor 458 passes through a bandpass filter formed by resistors 460 and 463, capacitors 461 and 462, and amplifier 464 to produce clamping voltage L. The bandpass filter is used to provide an enhanced punch effect. A low pass filter could also be used to create a standard punch effect. The clamp voltage L is set to an initial quiescent voltage by voltage source 465. The clamp voltage −L is simply an inversion of the clamped voltage L and is produced by resistors 466 and 467 and amplifier 468.

This circuit, for a sufficiently large and long tone burst, will produce a clipped output which diminishes from an initial value and then returns and may exceed its initial value.

COMBINATION BIAS SHIFTER AND DISTORTION SYNTHESIZER

Figure 11:
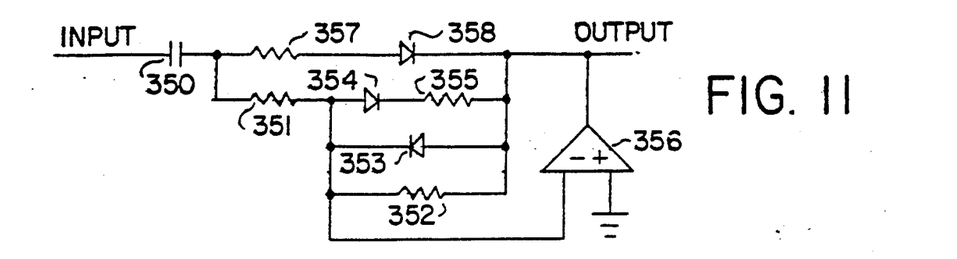
FIG. 11 is a schematic of the combination bias shifter and distortion stage according to the principles of the present invention.

The combination bias shifter and distortion synthesizer is shown in FIG. 11. This combination is needed if relatively small signals are being distorted and bias shifted. The stage input components are capacitor 350 and resistor 351 and the feedback components are resistors 352 and 355 and diodes 353 and 354. Operational amplifier 356 is connected in standard inverting manner with its non-inverting input grounded. These components form an amplifier with a gain determined by the input components 350 and 351 and the feedback resistor 352 for small signals. Resistor 352 is preferably variable to create a distortion gain control. Larger signals are clipped by the diodes 353 and 354. The resistor 355 is representative of an impedance that alters the shape of the clipping from that of a diode.

The bias shifting is done by resistor 357 an diode 358. These are similar to the resistor 83 and diode 86 of FIG. 3. The diode 358 however is not connected to ground as in FIG. 3 but is connected to the output. This small change effectively makes the diode 358 appear to have a small forward conduction voltage as needed for distorting low level signals. In either event, the capacitance 350 drives a changing impedance consisting of a resistor 351 when the diode 358 is not conducting and of resistors 351 and resistor 357 when diode 358 is conducting. This is a nonsymmetrical impedance, which produces even harmonics.

Note that the resistor or impedance 355 creates an asymmetrical clipping which still produces even harmonics because the clipping symmetry does not repair or compensate for the asymmetrical impedance of the bias shifter.

The response of the combination bias shifter and distortion synthesizer to a tone burst with the tone off for one second and on for one second with sufficient amplitude to cause the diodes 353, 354 and 358 to conduct is initially a signal with limited even harmonics created by resistor 355. Then as capacitor 350 charges, the output acquires even harmonics. During the no signal period, capacitor 350 discharges to prepare for the next tone burst.

ANOTHER ANALOG AMPLIFIER STRUCTURE

Figure 12:
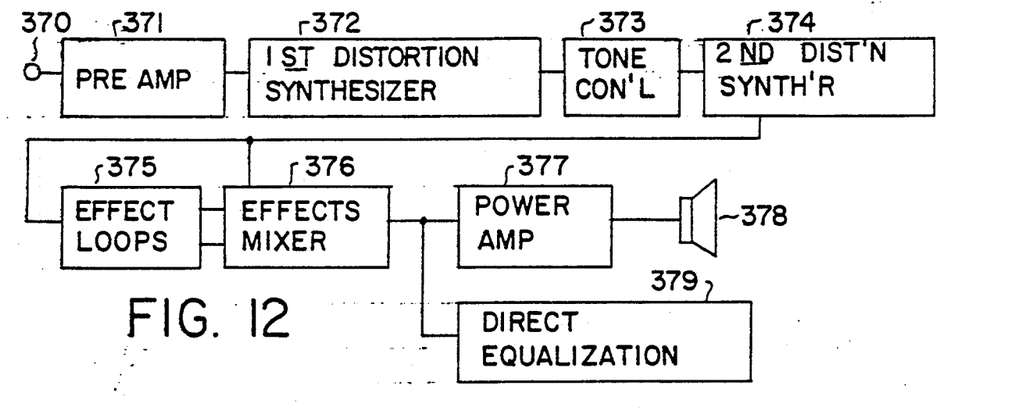
FIG. 12 is a block diagram of the overall structure of the amplifier according to the principles of the present invention.

FIG. 12 is a block diagram of a second embodiment of a semiconductor amplifier with tube amplifier characteristics. The amplifier has an input 370 which is the input to the preamplifier. The preamplifier 371 includes the capacitive input loading as discussed above with FIG. 10 to present the proper input impedance and includes filtering which establishes the basic tonal characteristic of the amplifier. The preamplifier 371 drives the first distortion circuit 372 which is preferably the combination bias shifter and distortion stage of FIG. 10. The resulting signal is tonally modified by tone controls 373 before being distorted again by the second distortion synthesizer 374 which is the harmonic generator of FIG. 7 driving the power supply effect emulator and punch circuit of FIG. 9. It should be noted that the resistor 330 of FIG. 9 is replaced by resistors 287 through 293 of FIG. 7. The output of the second distortion synthesizer 374 drives the effects loops 375. Both the second distortion synthesizer and effect loops 375 drive the effects mixer 376 which in turn drives the power amplifier 377 and speaker 378 and a direct equalization circuit 379. The direct equalization circuit 379 provides an output 380 representative of the signal produced by the speaker 378 and a microphone located very near the speaker.

The gains and clipping levels of the various stages are designed for the distorted sound so that the second distortion synthesizer 374 clips at lower levels than any prior stage, approximately 1 millivolt. The first distortion synthesizer 372 clips at about 5 millivolts. All of the other stages operate with little or no distortion. Signals below 1 millivolt are particularly subject to the non-constant gain stage. Harmonic gain analyses are given below to show that the non-constant gain stage has increasing harmonic gain for increasing input while the first distortion synthesizer 372 and the punch circuit of the second distortion synthesizer 374 have generally decreasing harmonic gains for increasing input.

DIRECT EQUALIZATION

Figure 13:
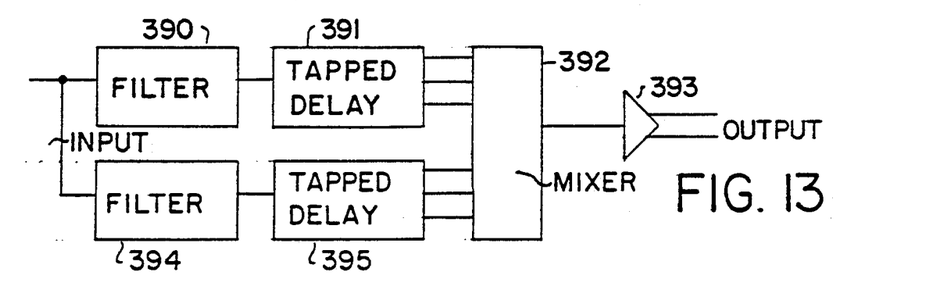
FIG. 13 is a block diagram of a speaker emulating circuit according to the principles of the present invention.

The direct equalization circuit 379 may be a filter, albeit complex, however the preferred equalization circuit is shown in FIG. 13. This direct equalization circuit 379 includes time delays representative of the transit time from various portions of a single speaker and/or various speakers to the microphone. Filters 390 and 394 alone may roughly approximate the proper frequency response, but fail to approximate the proper amplitude versus time response to a pulse. Time delays from different portions of speakers and different speakers are different and consequently enhance in phase frequencies while suppressing out of phase frequencies. Thus, time delays affect the frequency response of the speaker and microphone system.

Since the time delays deal with transit time frequency response effects, the filter need only deal with non-delay frequency response effects, such as speaker bass resonance and general treble rolloff.

The input drives filter 390 which emulates a speaker or a portion of a speaker. The filtered signal drives the tapped delay 391 which produces a multiplicity of delayed signals for mixing by mixer 392. The mixed signals are output by amplifier 393 in a balanced format. The input also drives other filters represented by a block 394 to emulate other speakers or other portions of a speaker. These filters drive the tapped delays 395 whose outputs are also mixed by mixer 392. The output of the mixer is the direct output.

The organization of multiple filters driving multiple delay lines is a generalization that can produce all needed signals at the mixer. However, it may be less expensive to implement required signals by putting filters between the delay outputs and the mixer as well. In either case the direct equalization is created with signal time delays and filters.

The tapped delay line may be a charge coupled or bucket brigade device now used in some reverberation effects.

DIGITAL EMBODIMENT

FIGS. 2-5 and 7-12 show circuits whose intent is to introduce harmonics of the input signal into the output circuit. The operational characteristics of some of these figures are translated into computer operations to also produce a digital system for purposely introducing harmonics of an input signal into the signal during the signal processing. Virtually all amplifiers and signal processors introduce harmonics of a signal into the signal However, this is generally not intentional and is usually considered a fault of the amplifier or signal processor. However, this is not the case with the present invention which intentionally introduces harmonics of a signal into the signal.

A measure of the intent to introduce harmonics of a signal into the signal for a system is to analyze the system assuming perfect components. The harmonics generation of a system that does not intend to introduce harmonics will then be at the limits of the mathematic processes, while one which intends to introduce harmonics will still have significant harmonics. Perfect characteristics for digital system include infinite sampling rates, computation rates, memory and precision.

Figure 14:
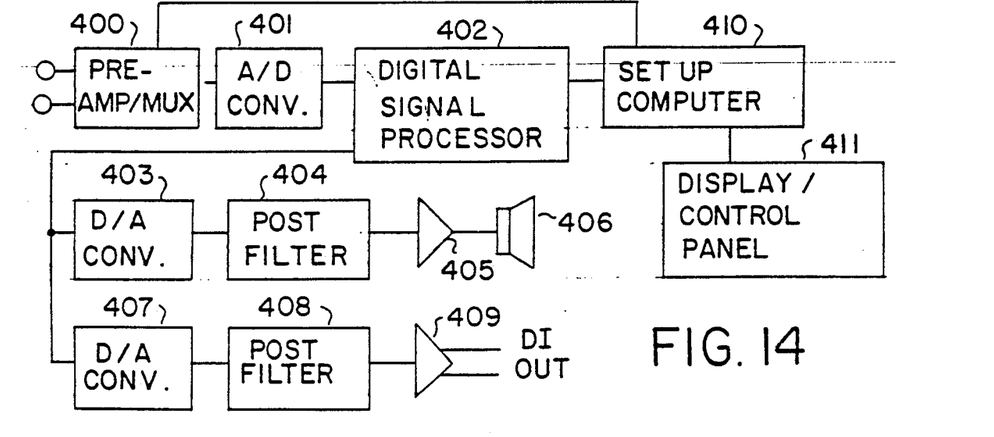
FIG. 14 is a block diagram of a computer system for emulating a guitar amplifier according to the principles of the present invention.

FIG. 14 is a block diagram of a digital computer system for emulating a guitar amplifier. The input of the amplifier is received by the preamplifier 400 which provides the proper loading to the guitar(s) or input source(s) and provides any filtering that is common to all desired tonal characteristics as well as providing anti-aliasing filtering required by the analog to digital converter 401. The digital signal processor 402 receives and processes the sampled signal. The processing provides the tonal characteristics of preamplifier 371 which may include resonances, the distortion and bias shifting of the first distortion synthesizer 372, the tone control of 373, the harmonic generation and power supply emulation of the second distortion synthesizer 374, the effects that may be connected to effects loop 375, the effects mixing of effects mixer 376, and the filtering and time delaying of the direct equalization 379. The digital signal processor 402 drives the digital to analog converter 403, post conversion filter 404, power amplifier 405 and speaker 406. Alternatively, the digital signal processor 402 drives the digital to analog converter 407, post conversion filter 408 and balanced output amplifier 409.

A setup computer 410 controls the digital signal processor 402 with filter type selections, filter parameters, gain values, and effects parameters from inputs from an electrical interface such as Musical Instrument Digital Interface, a footswitch, and panel controls 411. The setup computer also displays via 411 its operation mode and provides a user friendly interface for setup command editing.

A DIGITAL FILTER

A realistic question is how can a digital computer emulate the operation of tube amplifiers when so many have tried to make the short step to making a transistor amplifier that operates as a tube amplifier. The answer lies in an understanding of the tube amplifier, knowing the important effects and how they behave and knowing the important effects and ignoring them.

The tonal characteristic of the amplifier and the tone control behavior are set by filters which can be implemented digitally. The digital arts are replete with texts on digital filtering. A representative filter has a frequency response R(S) generalized and expressed in FORTRAN as:

$$R(S) = (A*S**2 + B*S + C)/(S**2 + D*S + E)$$

which may be rewritten as $$R(S) = (A + B/S + C/S2)/(1 + D/S + E/S2)$$

where
R(S) is the response
A high pass gain constant
B is a band pass gain constant
C is a low pass gain constant
D is a damping constant
E is a resonant frequency constant
S is the Laplace operator The terms in S of the second equation represent integrators. A simple form of the integrator is derived from the fundamental integration theory. An integral of a function is approximately the summation of the product of the function and the time that each functional value is assumed value. The theory further says that as the number of terms of the summation are increased by making the valid times smaller, the summation approaches the actual value of the integral. The following operation, if done sufficiently fast, will approximate the above response:

```
C    INITIALIZE THE PROGRAM
        V3 = 0.0
        V4 = 0.0
C    WAIT FOR THE TIMING PULSE AND GET INPUT
1       CALL WAIT
        CALL ATOD (V1)
C    FILTER THE INPUT
        V2 = V1 - D * V3 - E * V4
        V3 = V3 + DELTA * V2
        V4 = V4 + DELTA * V3
        V0 = A * V2 + B * V3 + C * V4
C    OUTPUT OF THE FILTERED VALUE
        CALL DTOO (V0)
        GO TO 1
```

The above program written in FORTRAN initialized V3 and V4 to zero in the first two statements. Next, the computer waits for the next compute timer pulse in subroutine WAIT. Then, it gets the input value V1 from the analog to digital converter via the subroutine ATOD. The next statement computes the input to the first integrator V2 per a weighted input formed from V1, V3 and V4 with weights −D and −E. Then in the next two statements, integrates V3 and V4. The value of DELTA is equal to the time it takes the above program to loop. The output value V0 is then computed as the weighted sum of V2, V3 and V4. The subroutine DTOA outputs the value to the analog world. Then the program loops to the call for subroutine WAIT.

The above example is for a two pole filter. The example may be extended to many poles by adding more variables that are similar to V3 and V4. The addition of another pole V5 would require a V5 term in the calculations of V2 and V0 and another line to integrate V5, V5=V5+DELTA*V4. Similarly, single pole filters are programmed by deleting the terms for V4 and the line which integrates V4.

As mentioned above there are many digital filtering techniques, the above is disclosed by way of example.

A further use of the filtering operation is to alter the resonance characteristic of a guitar or other instrument by producing additional and/or cancelling resonances. This is useful since an industry as grown in creating pickups with the proper sound. The filter example can be made resonant by simply making the value of D in the equation for R(S) above sufficiently small. In fact, a guitar with a non-resonant response could depend entirely on the amplifier for its tone and tonal variations.

A DIGITAL FIRST DISTORTION SYNTHESIZER

A first distortion synthesizer is the combination bias shifter and distortion circuit can be mathematically modeled as a high pass filter with a frequency cutoff dependent upon the polarity of the signal and a non-constant gain stage. The FORTRAN code for this stage is:

```
        FUNCTION FDST (V1)
        COMMON /FDSTP/ DEL(2), GAIN(20), OFFSET(20)
        COMMON /FDSTP/ JMIN, JMAX
```

```
        COMMON /FDSTI/ V3
C    DO HIGH PASS FILTER
        V2 = V1 - V3
        I = 1
        IF (V2 .GT. 0.0) I = 2
        V3 = V3 + DEL(I) * V2
C    DO NON-CONSTANT GAIN
        J = IFIX (V2)
        IF (J .GT. JMAX) J = JMAX
        IF (J .LT. JMIN) J = JMIN
        J = J - JMIN + 1
        FDST = V2 * GAIN (J) + OFFSET (J)
        RETURN
        END
```

The values for DEL would most likely be fixed for a given low frequency cutoff and speed of creating even harmonics. The values of DEL correspond to the asymmetrical impedance noted above.

The non-constant gain may be computed and approximated as Taylor's series truncated to the first derivative. The computation is then split into regions making the output a piecewise linear approximation to the desired non-linear gain. The values for GAIN and OFFSET are set by the setup computer 410 as a function of the distortion gain. A more exact computation of GAIN and OFFSET is given below in FORTRAN for the clipping function CF. CF is the clipping output as a function of the input.

$$RJ = FLOAT(J)$$

$$GAIN(J) = CF(RJ + 1.0) - CF(RJ)$$

$$OFFSET(J) = CF(RJ) - RJ * GAIN(J)$$

The variable V3 is initialized at the beginning of the program execution.

The non-constant gain in the above program is the first example of introducing harmonics of the signal into the signal. Notice that J is a function of the signal and the GAIN is a function of J. Therefore, GAIN is a function of the signal. This makes the relationship of the input to the output non-linear.

The harmonic gain of a non-constant gain is presented in the following table. The gain is 1 for an input between −1 and 1 and is 0 otherwise. V2 is the input value. Out 1 is the fundamental gain of FDST, Out 3 is the gain of the third harmonic, etc. A negative gain is a phase reversal.

TABLE 1

| | Limiter Harmonic Gain vs. Input Level | | | | | |
|---|---|---|---|---|---|---|
| VS | OUT 1 | OUT 3 | OUT 5 | OUT 7 | OUT 9 | THD % |
| 1.0 | 1.000 | 0.000 | 0.000 | 0.000 | 0.000 | 0.00 |
| 1.4 | 0.818 | 0.106 | −0.021 | −0.015 | 0.007 | 13.42 |
| 2.0 | 0.609 | 0.138 | 0.028 | −0.010 | −0.014 | 23.29 |
| 2.8 | 0.441 | 0.123 | 0.049 | 0.015 | −0.001 | 30.34 |
| 4.0 | 0.315 | 0.096 | 0.048 | 0.025 | 0.012 | 35.43 |
| 5.7 | 0.224 | 0.072 | 0.039 | 0.025 | 0.016 | 39.20 |
| 8.0 | 0.159 | 0.052 | 0.030 | 0.020 | 0.014 | 41.75 |
| 11.3 | 0.112 | 0.037 | 0.022 | 0.015 | 0.011 | 43.64 |
| 16.0 | 0.080 | 0.026 | 0.016 | 0.011 | 0.008 | 45.00 |
| 22.6 | 0.056 | 0.019 | 0.011 | 0.008 | 0.006 | 45.97 |
| 32.0 | 0.040 | 0.013 | 0.008 | 0.006 | 0.004 | 46.66 |

The important fact to note in the above table is that the fundamental gain decreases with increasing input. Other harmonic gains rise or oscillate from zero to a maximum and then also decrease.

The response of the first distortion synthesizer is similar to that of the combination bias shifter and distortion synthesizer to a tone burst with the tone off for one second and on for one second with sufficient amplitude to cause the value of J to be limited to JMAX or JMIN is initially a signal with limited even harmonics. Then, as value V3 changes, the output acquires even harmonics. During the no signal period, value V3 returns to zero to prepare for the next tone burst.

DIGITAL TONE CONTROLS

The tone controls are simply a collection of filters with variable, linear gains as discussed above. The filter and gain parameters are set by the setup computer by commands dictating the sound of the amplifier. This arrangement allows every tone control or filter to be parametric. It further allows the digital amplifier to emulate different types of currently produced amplifiers since they operate with different tone parameters.

A DIGITAL SECOND DISTORTION SYNTHESIZER

The second distortion synthesizer consists of another non-constant gain stage followed by the power supply emulator and punch circuit. The FORTRAN code for such a stage is:

```
      FUNCTION SDST (V1)
      COMMON /SDSTP/ GCONST, GEVEN, GODD
      COMMON /SDSTP/ DECAY, CHARGE, PUNCH
      COMMON /SDSTP/ DELTA, PSD, PSE, PSB, PSF
      COMMON /SDSTI/ PS, VC337, V5, V6
C     COMPUTE THE NON-CONSTANT GAIN
      GAIN = GCONST + V1 * GIVEN + ABS(V1) * GODD
      V2 = V1 * GAIN
C     CLIP OUTPUT PER POWER SUPPLY EFFECT
      IF (V2 .GT. PS) V2 = PS
      IF (V2 .LT. -PS) V2 = -PS
C     COMPUTE THE POWER SUPPLY
      IF (V2 .GT. VC337) GO TO 1
      VC337 = VC337 * DECAY
      GO TO 2
1     VC337 = VC337 + (V2 - VC337) * CHARGE
2     CONTINUE
      V3 = VC337 * PUNCH
      V4 = V3 - PSD * V5 - PSE * V6
      V5 = V5 + DELTA * V4
      V6 = V6 + DELTA * V5
      PS = PSF - PSB * B5
      SDST = V2
      RETURN
      END
```

As above, all of the values for the variable in the COMMON /SDSTP/ statements are supplied by the setup computer 410, or are fixed. The variables in the COMMON /SDSTI/ statement are initialized at the beginning of the program execution.

By way of example, this non-constant gain follows the square law approximation for tube distortion. The statement computing GAIN has a term containing the variable GODD for emulating the balanced gain of the output tubes and has a term containing the variable GEVEN for emulating the unbalanced gain of the output tubes. The non-constant gain in the above program is the second example of introducing harmonics of the signal into the signal. The variable VC337 is similar to the voltage on capacitor 337 of FIG. 9. PUNCH is the setting of the potentiometer 338. The next four lines of code is a filter which creates a signal indicative of the maximum signal level available at the output of the circuit in FIG. 9.

The response to the power supply effect emulator and punch circuit to a tone burst with the tone off for one second and on for one second with sufficient amplitude to cause the circuit to clip is initially a maximum, but then in approximately 0.2 seconds, decays to a minimum level. Then the output level returns to the maximum in about 0.5 seconds. When the tone burst goes off the punch effect values VC337, V5 and V6 discharge in preparation for the next tone burst. Value PUNCH controls the minimum level and the extent of the punch effect.

Just as the circuit of FIG. 9 may be altered so that the clipping effects include frequency effects, the above program can be altered so that its clipping effects include frequency. The process for creating this code is the same as the process for writing circuit simulators, such as SPICE, SCEPTRE, and NET. A reference for the formulation of SCEPTRE is "SCEPTRE, A Computer Program for Circuit and Systems Analysis," J. C. Bowers et al., Prentice Hall, Englewood Cliffs, N.J., 1971.

The following table presents the gain of various harmonics as a function of the input signal. These values were calculated based on GCONST=1.0; GODD=0.1; and GEVEN=0.05. Out 1 is the fundamental content of V2 normalized by V1; Out 2 is the second harmonic content of V2 normalized by V1; etc.

TABLE 2

| | Non-Linear Amp Harmonic Gain vs. Input Level | | | | | |
|---|---|---|---|---|---|---|
| VS | OUT 1 | OUT 2 | OUT 3 | OUT 5 | OUT 7 | THD % |
| 0.1 | 1.0085 | 0.0025 | 0.0047 | 0.0019 | 0.0012 | 1.48 |
| 0.2 | 0.0170 | 0.0050 | 0.0093 | 0.0028 | 0.0024 | 2.93 |
| 0.3 | 1.0255 | 0.0075 | 0.0140 | 0.0056 | 0.0036 | 4.36 |
| 0.4 | 1.0340 | 0.0100 | 0.0187 | 0.0075 | 0.0048 | 5.77 |
| 0.5 | 1.0424 | 0.0125 | 0.0233 | 0.0094 | 0.0060 | 7.15 |
| 0.6 | 1.0509 | 0.0150 | 0.0280 | 0.0113 | 0.0072 | 8.52 |
| 0.7 | 1.0594 | 0.0175 | 0.0327 | 0.0132 | 0.0083 | 9.86 |
| 0.8 | 1.0679 | 0.0200 | 0.0373 | 0.0151 | 0.0095 | 11.17 |
| 0.9 | 1.0764 | 0.0225 | 0.0420 | 0.0169 | 0.0107 | 12.47 |
| 1.0 | 1.0849 | 0.0250 | 0.0467 | 0.0188 | 0.0119 | 13.75 |

Notice that the gains for all harmonics and the total harmonic distortion (THD) increase as the input V1 becomes larger. This is also apparent from the calculations of GAIN and V2 in the above program. Thus, this demonstrates a digital system with a gain which is the function of the input intentionally introducing harmonics of the input signal into the output. Although there are extra signals produced by the sampling and desampling processes, these signals are not intentionally introduced by the signal processor, but exist because of the conversion processes required by the use of a digital signal processor. This further demonstrates a range of input for which the rate of harmonic introduction, i.e. harmonic gain, increases as the input increases.

Since SDST is similar to the variable gain circuitry of FIGS. 7 and 8, it provides a similar relationship between the input and harmonic gain.

Once the signal V2 exceeds the limit PS, the harmonic content begins to behave as outlined in Table 1. As for the second analog embodiment of FIG. 12, the digital embodiment must have gains and clipping levels designed so that low level input signals are not clipped in the second distortion synthesizer and consequently have increasing harmonic gain for increasing signals, and that high level signals are clipped by the second distortion synthesizer or both the first and the second distortion synthesizers and consequently have oscillating or decreasing harmonic gain for increasing signals.

Ignoring effects of system noise, the total harmonic distortion always increases for increasing input signals.

DIGITAL DIRECT EQUALIZATION

The direct equalization is a combination of one or more filters, associated tapped delays and a mixer. The filter is a variation on the filters already coded. The tapped delay is a first in first out (FIFO) storage array. The mixer is simply a weighted sum of values. The code in FORTRAN is:

```
      SUBROUTINE DIRECT (V1)
      COMMON /DRCTP/ DIDEL, DIA, DIB, DIC, DID
      COMMON /DRCTP/ DIE, DIF, DIG, IT1, IT2, IT3
      COMMON /DRCTP/ DMA, DMB, DMC, DMD
      COMMON /DRCTP/ V3, V4, V5, I, FIFO (200)
C   COMPUTE THE FILTER OUTPUT
      V2 = V1 - DIE * V3 - DIF * V4 - DIG * V5
      V3 = V3 + DIDEL * V2
      V4 = V4 + DIDEL * V3
      V5 = V5 + DIDEL * V4
      V0 = DIA * V2 + DIB * V3 + DIC * v4 +
      DID * V5
C   INPUT TO THE FIFO ARRAY
      I = 1 + MOD (I + 1, 200)
      FIFO (I) = V0
C   GET THE TAP VALUES
      V6 = FIFO (1 + MOD(I - IT1, 200))
      V7 = FIFO (1 + MOD(I - IT2, 200))
      V8 = FIFO (1 + MOD(I - IT3, 200))
C   MIX THE TAPS AND OUTPUT THE RESULT
      V9 = DMA * V0 + DMB * V6 + DMC * V7 +
      DMD * V8
      CALL DDTOA (V9)
      RETURN
      END
```

The values in the COMMON /DRCTP/ are set by the setup computer or are fixed values. The values in the COMMON /DRCTI/ are initialized at the beginning of the computer program execution. By way of example, the filter is a generalized third order. The function MOD (J,K) is the modulo operation is the remainder of the division of J by K. Although some modulo functions will produce a negative result for negative J, this modulo function always produces a result between zero and K. The subroutine DDTOA outputs the value V9 to the digital to analog converter 407 is FIG. 14.

The above example only implements a single filter and tapped delay. More filters and delays are done similarly.

DIGITAL AMPLIFIER MAIN PROGRAM

The code for the entire amplifier may now be written in FORTRAN:

```
      PROGRAM AMP
      COMMON /AMPP/ VOLUME, MIX1, MIX2
      CALL INIT
1     CALL WAIT
      CALL ATOD (VATOD)
      VA = SDST (TONE (FDST (PREAMP (VATOD))))
      VAMP = VOLUME * (VA + MIX1 * EFFCT1 (VA) +
    * MIX2 * EFFCT2 (VA))
      CALL ADTOA (VAMP)
      CALL DIRECT (VAMP)
      GO TO 1
      END
```

The subroutine INIT initializes all of the variables needed initialization. The subroutine WAIT waits for a timing pulse to begin calculations. Routine ATOD gets a value from the analog to digital converter 401 of FIG. 14. PREAMP is a filtering routine which sets the fundamental tone of the amplifier. FDST and SDST are distortion functions discussed above. TONE is the tone control filtering function. EFFCT1 and EFFCT2 are effect functions such as flanging, chorusing, reverberation, vibrato, pitch change. These functions are currently sold in both analog and digital forms. This line also mixes the effects with the dry signal VA and sets the output volume. The subroutine ADTOA outputs a value to the digital to analog converter 403 of FIG. 14. After the direct equalization and output is handled by DIRECT the program loops back to wait for the next calculate timing pulse.

A DIGITAL COMPRESSOR

The amplifier program can be readily modified for use with a bass guitar by substituting a compressor emulating routine for FDST. A compressor examines its output signal level with a rectifier and filters and adjusts the compressor gain accordingly to produce a nearly constant output signal level. The functionality of this established art can be readily incorporated into a digital amplifier. In fact, the versatility of the amplifier is only limited by the throughput of the digital signal processor and the size of the program memory. The following is a program for a compressor:

```
      FUNCTION CMPRS (V1)
      COMMON /CMPRSP/ CDECAY, CATACK, GMAX
      COMMON /CMPRSI/ CGAIN, VSIG
C   COMPUTE THE OUTPUT
      CMPRS = CGAIN * V1
C   COMPUTE THE GAIN
      REC = ABS (CMPRS)
      IF (REC .GT. VSIC) GO TO 1
      VSIG = VSIG * CDECAY
      GO TO 2
1     VSIG = VSIG + (REC - VSIG) * CATACK
2     CONTINUE
      CGAIN = GMAX - VSIG
      RETURN
      END
```

The output of the compressor CMPRS is simply the input times the internally generated gain value CGAIN. REC is the absolute value of or full wave rectified output. The value VSIG is a simply filtered value of the rectified output. The filtering uses different time constants CDECAY and CATACK for the decay and attach times. VSIG is then used to compute the gain. The simple filtering of VSIG and computational algorithm for CGAIN is for example only, more complex algorithms may be more useful. The values CDECAY, CATACK, and GMAX are provided by the setup computer, while CGAIN and VSIG are initialized at the beginning of program execution.

INPUT MULTIPLEXING AND OTHER VARIATIONS

The versatility of the digital amplifier is so great that musicians will want to play a variety of instruments through it. To facilitate this, the preamp 400 is adapted to receive a multiplicity of input signals and to multiplex or select one of these signals for the output to the analog to digital converter 401. The multiplexing or selection is done under control from the setup computer 410

The output of the digital amplifier, the digital to analog converters 403 and 407, the post conversion filters 404 and 408, amplifiers 405 and 409, and speaker 406, may be replaced or augmented by other types of digital outputs such as an interface to a digital tape recorder.

The multiplicity of the digital to analog converters, such as 403 and 407, and the digital processing capability which can create effects, permit the creation of psuedo-stereophonic signals. The stereo effects are created by processing a signal two ways so that the resulting signal has different tonal and timing characteristics.

One familiar with the amplifier and electronic arts can create tube amplifier synthesizers other than described above. Although the present invention has been described and illustrated in detail, it is to be clearly understood that the same is by way of illustration and example only, and is not to be taken by way of limitation. The spirit and scope of the present invention are to be limited only by the terms of the appended claims.

What is claimed:

1. A semiconductor distortion system comprising: input means for receiving an input signal; a first distortion means for introducing distortion to produce a first distorted signal; a tone control means for altering the tonality of the first distorted signal and producing a tone control signal; a second distortion means for clipping the tone control signal at a level which is a function of a resulting clipped signal; and an output means.

2. The semiconductor distortion system of claim 1, wherein said input means and output means each include amplifiers.

3. The semiconductor distortion system of claim 1, wherein said input means includes a preamplifier and filtering means for filtering the input signal to produce a fundamental tonality of the amplifier.

4. The semiconductor distortion system of claim 1, wherein said first distortion means includes means for limiting said input signal and introducing even harmonics.

5. The semiconductor distortion system of claim 1, wherein said first distortion means includes an asymmetrical bias shifting means and a limiting means.

6. The semiconductor distortion system of claim 5, wherein said bias shifting means includes an asymmetrical impedance and a capacitor.

7. The semiconductor distortion system of claim 1, wherein said second distortion means includes an input terminal and an output terminal; amplifier means having a first input connected to said input terminal, a second input and an output; limiter means connected to the output of said amplifier means for limiting the output of said amplifier means; filter means connecting said limiter means to said output terminal; and feedback means connecting said output means terminal to said second input of said amplifier means.

8. The semiconductor distortion system of claim 7, wherein said first distortion means includes bias shifter means for asymmetrically transmitting input signals above a preselected value.

9. The semiconductor distortion system of claim 1, wherein said second distortion means includes clipping means for clipping the resultant signal as a function of the frequency content of said resultant signal.

10. The semiconductor distortion system of claim 1, wherein said second distortion means includes a transformerless filter means having a region of frequencies which are passed preferentially; and means for reducing said region as a function of increasing amplitude of an input to said semiconductor distortion system.

11. A semiconductor distortion system comprising:
input means including conversion means for converting an analog input signal to a digital input signal;
a digital processor having a first distortion program for introducing distortion to produce a first distorted signal by clipping, a tone control program for altering the tonality of the first distorted signal and producing a tone controlled signal, and a second distortion program for clipping the tone controlled signal:
said first distortion program including a filtering program to filter the input signal prior to being clipped by said first distortion program; and
an output means.

12. The semiconductor distortion system of claim 11, wherein said filtering includes resonances.

13. A semiconductor distortion system comprising:
input means including conversion means for converting an analog input signal to a digital input signal;
a digital processor having a first distortion program for introducing distortion to produce a first distorted signal, a tone control program for altering the tonality of the first distorted signal and producing a tone controlled signal, and a second distortion program for clipping the tone controlled signal at a level which is a function of a resultant clipped signal; and
an output means.

14. The semiconductor distortion system of claim 13, wherein said clipping is also a function of time.

15. The semiconductor distortion system of claim 13, wherein said clipping is also a function of the frequency content of the resultant signal.

16. A semiconductor distortion system comprising:
input means including conversion means for converting an analog input signal to a digital input signal;
a digital processor having a first distortion program for introducing distortion to produce a first distorted signal, a tone control program for altering the tonality of the first distorted signal and producing a tone controlled signal, and a second distortion program for clipping the tone controlled signal; and
an output means.

17. The semiconductor distortion system of claim 16, wherein said first distortion program compresses said input signal.

18. The semiconductor distortion system of claim 16, wherein said input means includes a preamplifier for receiving an analog input and producing an analog signal for said conversion means, said preamplifier includes means for increasing the input capacitance of the amplifier above the stray wiring capacitance for properly loading the input source.

19. The semiconductor distortion system of claim 16, wherein said second distortion program receives a first value, computes a second value as a function of a first value wherein the ratio of the second value to the first value increases for increasing magnitude of the first value.

20. The semiconductor distortion system of claim 16, wherein said input means includes a multiplexer means for selecting which of a multiplicity of input signals to be processed.

21. The semiconductor distortion system of claim 16, wherein said tone control program alters the tone parametrically.

22. The semiconductor distortion system of claim 16, wherein said digital processor further includes emulation program for emulating the signal transformation of a speaker audibly driving a microphone wherein said emulation program includes a filter program, a time delay program and mixing program.

23. The semiconductor distortion system of claim 22, wherein said filter program includes a resonance approximating the bass resonance of a speaker.

24. The semiconductor distortion system of claim 22, wherein said time delay program includes a time delay approximating the difference in the transit times of sounds from one side of a speaker to a microphone and from another side of said speaker to said microphone.

25. The semiconductor distortion system of claim 22, wherein said time delay program includes a time delay approximating the difference in the transit times of sounds from a first speaker to a microphone and a second speaker to said microphone.

26. A semiconductor distortion system comprising:
input means including conversion means for converting an analog input signal to a digital input signal;
a digital processor having a first distortion program for introducing even harmonic distortion to produce a first distorted signal, a tone control program for altering the tonality of the first distorted signal and producing a tone controlled signal, and a second distortion program for clipping the tone controlled signal; and
an output means.

27. A semiconductor distortion system comprising:
input means including conversion means for converting an analog input signal to a digital input signal;
a digital processor having a first distortion program for introducing distortion to produce a first distorted signal, a tone control program for altering the tonality of the first distorted signal and producing a tone controlled signal, and a second distortion program for clipping the tone controlled signal;
said second distortion program includes limiting, filtering and feedback program; and
an output means.

28. A semiconductor distortion system comprising:
input means for receiving an input signal;
a first distortion means for introducing distortion to produce a first distorted signal;
a tone control means for altering the tonality of the first distorted signal and producing a tone controlled signal;
a second distortion means including transfer means having an input and output for introducing harmonics into said tone controlled signal and increasing the ratio of the output signal to the input signal for an increasing input signal and means for clipping the resultant signal; and
an output means.

29. A semiconductor distortion system of claim 28, wherein said transfer means includes a plurality of switch means responsive to said input of said second distortion means for progressively adding parallel resistors to progressively increase the output current.

30. The semiconductor distortion system of claim 28, wherein said input means includes a preamplifier and filtering means for filtering said input signal to produce a fundamental tonality of the amplifier.

31. The semiconductor distortion system of claim 28, wherein said first distortion means includes means for limiting said input signal and introducing even harmonics.

32. The semiconductor distortion system of claim 28, wherein said first distortion means includes an asymmetrical bias shifting means and a limiting means.

33. The semiconductor distortion system of claim 32 wherein said bias shifting means includes an asymmetrical impedance and a capacitor.

34. A semiconductor distortion system comprising:
input means for receiving an input signal;
a first distortion means for introducing distortion to produce a first distorted signal;
a tone control means for altering the tonality of the first distorted signal and producing a tone controlled signal;
a second distortion means including an input and an output terminal, a clipping means, an amplifier means, a limiter means, a filter means and a feedback means interconnected between said input and output terminals; and
an output means.

35. The semiconductor distortion system of claim 34, wherein said input means includes a preamplifier and filtering means for filtering the input signal to produce a fundamental tonality of the amplifier.

36. The semiconductor distortion system of claim 34, wherein said first distortion means includes means for limiting said input signal and introducing even harmonics.

37. The semiconductor distortion system of claim 34, wherein said first distortion means includes an asymmetrical bias shifting means and a limiting means.

38. The semiconductor distortion system of claim 37, wherein said bias shifting means includes an asymmetrical impedance and a capacitor.

* * * * *